United States Patent
Boerstler et al.

(10) Patent No.: US 6,972,604 B2
(45) Date of Patent: Dec. 6, 2005

(54) CIRCUIT FOR COMPENSATING LPF CAPACITOR CHARGE LEAKAGE IN PHASE LOCKED LOOP SYSTEMS

(75) Inventors: David William Boerstler, Round Rock, TX (US); Eskinder Hailu, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 21 days.

(21) Appl. No.: 10/840,562

(22) Filed: May 6, 2004

(65) Prior Publication Data

US 2005/0248376 A1 Nov. 10, 2005

(51) Int. Cl.[7] .............................................. H03L 7/00
(52) U.S. Cl. ...................................... 327/156; 327/558
(58) Field of Search ............................... 327/147, 154, 327/156, 155, 162, 53, 66, 558, 551, 555

(56) References Cited

U.S. PATENT DOCUMENTS

| | | | |
|---|---|---|---|
| 4,229,699 A | 10/1980 | Frissell ........................ 327/407 |
| 4,250,411 A | 2/1981 | Kriedt ......................... 330/254 |
| 4,970,405 A | 11/1990 | Hagiwara ..................... 326/93 |
| 5,099,141 A | 3/1992 | Utsunomiya ................. 327/145 |
| 5,113,862 A | 5/1992 | Mortazavi ................... 600/331 |
| 5,122,677 A | 6/1992 | Sato ........................... 327/147 |
| 5,155,380 A | 10/1992 | Hwang et al. ................. 327/99 |
| 5,231,636 A | 7/1993 | Rasmussen .................. 327/407 |
| 5,315,181 A | 5/1994 | Schowe ....................... 327/152 |
| 5,357,146 A | 10/1994 | Heimann ..................... 327/292 |
| 5,449,999 A | 9/1995 | Edwards ...................... 322/28 |
| 5,489,888 A | 2/1996 | Jagiella et al. ............... 340/537 |
| 5,729,179 A | 3/1998 | Sumi .......................... 327/115 |
| 5,754,067 A | 5/1998 | Komatsu et al. ............. 327/115 |
| 5,787,135 A | 7/1998 | Clark ......................... 375/376 |
| 6,157,694 A | 12/2000 | Larsson ....................... 377/48 |
| 6,265,930 B1 | 7/2001 | Walker et al. ............... 327/407 |
| 6,285,263 B1 | 9/2001 | Anderson .................... 331/34 |
| 6,346,851 B1 * | 2/2002 | Zhang et al. ................ 327/558 |
| 6,388,506 B1 | 5/2002 | Voo ............................ 327/536 |
| 6,396,305 B1 | 5/2002 | Carlson ....................... 326/98 |
| 6,466,096 B1 | 10/2002 | DeVito ........................ 331/11 |
| 6,501,304 B1 | 12/2002 | Boerstler et al. ............ 327/99 |

OTHER PUBLICATIONS

Schroder, Deiter K.; "Semiconductor Material and Device Characterization"; John Wiley & Sons, Inc., 1998, p. 391-394.

* cited by examiner

*Primary Examiner*—Linh My Nguyen
(74) *Attorney, Agent, or Firm*—Carr LLP; Diana R. Gerhardt

(57) ABSTRACT

The present invention provides for a low pass filter. A first capacitor, has a first associated leakage current. A second capacitor has a specified capacitance that is a fraction of the capacitance of the first capacitor, the second capacitor further having a second associated leakage current. A voltage follower circuit is coupled to the output of the first and second capacitor. First and second current sources are coupled to the voltage follower circuit. A bias current source is coupled the first current source. A current mirror is coupled to the second current source, and the current mirror is further coupled to at least the anode of the first capacitor, thereby generating replacement current of a capacitor within a low-pass filter.

15 Claims, 2 Drawing Sheets

CIRCUIT FOR COMPENSATING LPF CAPACITOR CHARGE LEAKAGE IN PHASE LOCKED LOOP SYSTEMS

TECHNICAL FIELD

The invention relates generally to controlling leakage current in a capacitor and, more particularly, to controlling leakage current in a capacitor within a phase locked loop.

BACKGROUND

Phase Locked Loops (PLLs) can be an integral component of systems that use clocking for various operations. These systems can include microprocessors, wireless/wireline transceivers, and other devices known to those of skill in the art. Generally, PLLs are used to generate an output waveform which has a timing relationship with an input waveform, such as a 1:1 ratio, a 2:1 ratio, and so on. For instance, an input waveform of 60 Hertz could be inputted into a PLL to generate an output waveform of 120 Hertz. Furthermore, there would be a predefined phase relationship between the input wave and the output wave.

One important element of a PLL is a low pass filter, which typically comprises passive elements, such as capacitors and resistors. In a PLL, the voltage on the LPF is used as an input signal to a voltage controlled oscillator (VCO). Therefore, the voltage on the capacitor should remain stable, so that a stable oscillation occurs within the PLL, thereby leading to a stable output frequency.

Often, metal oxide semiconductors (MOSs) can be used as capacitors within a PLL. For instance, the gate and the source, or the gate and the drain, of a MOS can be used within an integrated circuit as the cathode and anode of a capacitor. However, with the rapid advancement of CMOS technology and the resulting reduction the gate oxide thickness, a regime is being entered wherein the effect of leakage current through the gate dielectric is a problem.

There are two major regimes pertaining to gate leakage in metal-oxide-semiconductor (MOS) devices. These regimes are the "Fowler-Nordheim" regime and the "direct tunneling" regime. In the Fowler-Nordheim tunneling regime, which is dominant for thick (greater the 50 angstrom) oxides, the tunneling is a two-step process. In the first phase, in the presence of a large electric field, carriers at the oxide-semiconductor interface are accelerated. This increases the energy of the carriers (the carriers become 'hot') such that the barrier they encounter is reduced from trapezoidal to triangular. The tunneling current for the Fowler-Nordheim regime is proportional to the below:

$$I \alpha E_{ox}^2 exp(-B[1-(1-qV_{ox}/C)^{1.5}/E_{ox})$$

wherein "$E_{ox}$" is the electric field strength across the gate oxide/dielectric, which is dependent on the potential ($V_{ox}$) across the MOS capacitor, and B is a constant.

In the direct tunneling regime, the oxide is thin enough for carriers to directly tunnel across the trapezoidal barrier. The current in the direct tunnel regime is proportional to the following equation:

$$I \alpha E_{ox}^2 exp(-B[1-(1-qV_{ox}/C)^{1.5}/E_{ox})$$

wherein $E_{ox}$ is the electric field across the gate oxide/dielectric, q is the electric change in coulombs, $V_{ox}$ is the voltage across the capacitor dielectric, and B and C are constants. In both of the above equations, the leakage current is exponentially dependent on the voltage across the capacitor.

Generally, the leakage current through the capacitor is exponentially dependent upon the voltage across, as well as the thickness of, the gate dielectric. That is, as the thickness of the gate dielectric gets smaller, the leakage current increases exponentially. Also, increasing the voltage across the capacitor will result in an exponential increase in leakage current.

One trend in device technology is for thinner gate dielectrics to help achieve higher performance. However, the penalty for this is the associated exponential increase in leakage current.

In a PLL, the effect of capacitance leakage on PLL performance can be most noticeable when the PLL is in the "locked" state (that is, there is a determined relationship between the input phase and the output phase of the waveforms) and the capacitor is not being charged by either charge pump, what is otherwise referred to as a "high Z" state. Suppose, just before the PLL locks, the voltage at Node X in FIG. 1 is set to a voltage value V. Once the PLL is locked, the charge pumps are both disconnected, but for stable operation, the voltage at Node X should also remain stable. However, due to gate leakage of the large MOS device which is used as a capacitor, the voltage at Node X decays to ground with a time constant that is determined by the effective resistance associated with the tunneling current as well as the value of the capacitance. In some cases, the low pass filter cap is not too leaky. In other words, the time duration over which the discharging takes place is large enough that the resulting jitter will have most of its spectral components within the PLL loop bandwidth. As a result, this jitter is not filtered out.

One conventional solution to minimize this effect is to add a resistor in parallel with the low pass filter capacitor between Node X of FIG. 1 and electrical ground. If this added resistor has a value smaller than the effective resistance associated with the tunneling current in the filter capacitor, the resulting jitter at Node X will have its spectrum pushed out to higher frequencies. However, the addition of this resistor reduces the effective dominant pole frequency of the PLL, thereby reducing PLL bandwidth. So, one faces the tradeoff of lowered PLL bandwidth with reduced leakage induced jitter.

In the time domain, this resistor can be considered as making the PLF capacitor more leaky, thereby pushing the center of the spectral distribution of the jitter at Node X to a higher frequency, which can subsequently be filtered out. However, while long-term jitter is filtered out, the output of the VCO can suffer from substantial cycle-to-cycle jitter.

Therefore, there is a need to minimize jitter due to leaky filter capacitors that avoids at least some of the trade offs between loop bandwidth and jitter suppression.

SUMMARY OF THE INVENTION

The present invention provides for a low pass filter. A first capacitor, has a first associated leakage current. A second capacitor has a specified capacitance that is a fraction of the capacitance of the first capacitor, the second capacitor further having a second associated leakage current. A voltage follower circuit is coupled to the output of the first and second capacitor. First and second current sources are coupled to the voltage follower circuit. A bias current source coupled to the drain of the first current source. A current mirror is coupled to the drain of the second current source, the current mirror further coupled to at least the anode of the first capacitor.

BRIEF DESCRIPTION OF THE DRAWINGS

For a more complete understanding of the present invention, and the advantages thereof, reference is now made to the following Detailed Description taken in conjunction with the accompanying drawings, in which.

DETAILED DESCRIPTION

In the following discussion, numerous specific details are set forth to provide a thorough understanding of the present invention. However, those skilled in the art will appreciate that the present invention may be practiced without such specific details. In other instances, well-known elements have been illustrated in schematic or block diagram form in order not to obscure the present invention in unnecessary detail. Additionally, for the most part, details concerning network communications, electro-magnetic signaling techniques, and the like, have been omitted inasmuch as such details are not considered necessary to obtain a complete understanding of the present invention, and are considered to be within the understanding of persons of ordinary skill in the relevant art.

In the remainder of this description, a processing unit (PU) may be a sole processor of computations in a device. In such a situation, the PU is typically referred to as an MPU (main processing unit). The processing unit may also be one of many processing units that share the computational load according to some methodology or algorithm developed for a given computational device. For the remainder of this description, all references to processors shall use the term MPU whether the MPU is the sole computational element in the device or whether the MPU is sharing the computational element with other MPUs, unless otherwise indicated.

It is further noted that, unless indicated otherwise, all functions described herein may be performed in either hardware or software, or some combination thereof. In a preferred embodiment, however, the functions are performed by a processor, such as a computer or an electronic data processor, in accordance with code, such as computer program code, software, and/or integrated circuits that are coded to perform such functions, unless indicated otherwise.

Figure 1:
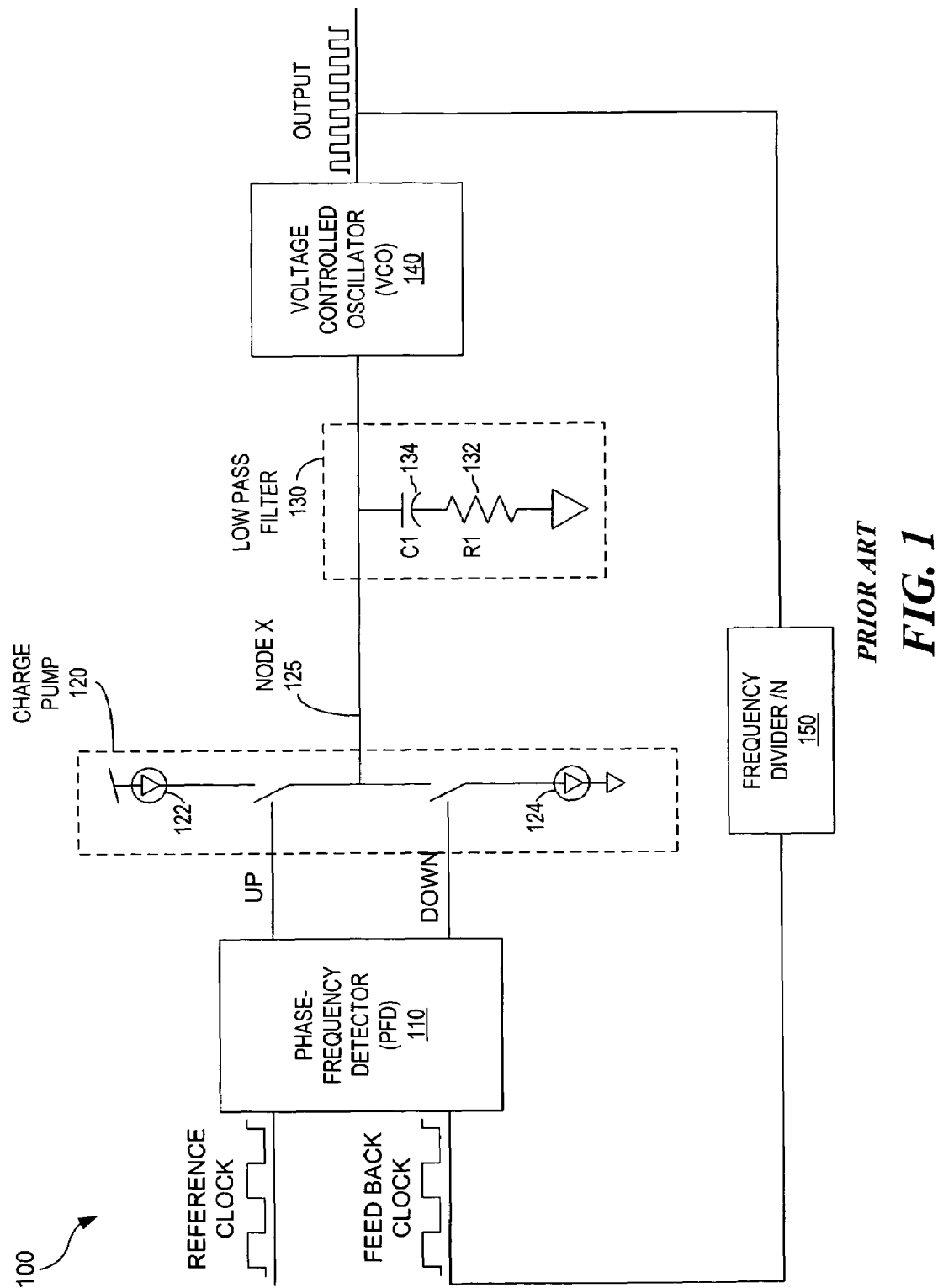
FIG. 1 schematically depicts a prior art PLL circuit.

Turning to FIG. 1, disclosed is a prior art PLL circuit 100. Turning now to FIG. 1, illustrated is a PLL 100. A phase-frequency detector (PFD) 110 is coupled to a charge pump 120. The charge pump 120 has a current source 122 and current sink 124. The PFD 110 compares the difference between phases of a reference clock frequency and the feedback clock frequency to thereby generate signals to charge the capacitor 134 of the low pass filter 130 through use of the current source 122 or the current sink 124. The voltage on the anode of capacitor 134 is then applied to a voltage controlled oscillator (VCO) 140. The VCO generates an oscillatory output signal at a given frequency as a function of the capacitor 134 voltage. The output of the VCO 140 is then divided in a frequency divider /n 150, and fed back into the PFD 110.

However, should the charge pumps 120 be turned into the "off" condition by the PFD 110, there is no replacement of charge at the capacitor 134, as it continues to drain through a resistor 132. Therefore, there would be "drift" of voltage by the capacitor 134 as charge leaks out of the capacitor 134, which then changes the signal output frequency of the VCO.

This changed output is then fed back into the PDF 110, after the frequency divider 150 has processed the changed signal. The PDF 110 would then alter its output to compensate for this change. This drift of output signal of the VCO 140 could lead to an undesirable oscillation of the output frequency signal.

Figure 2:
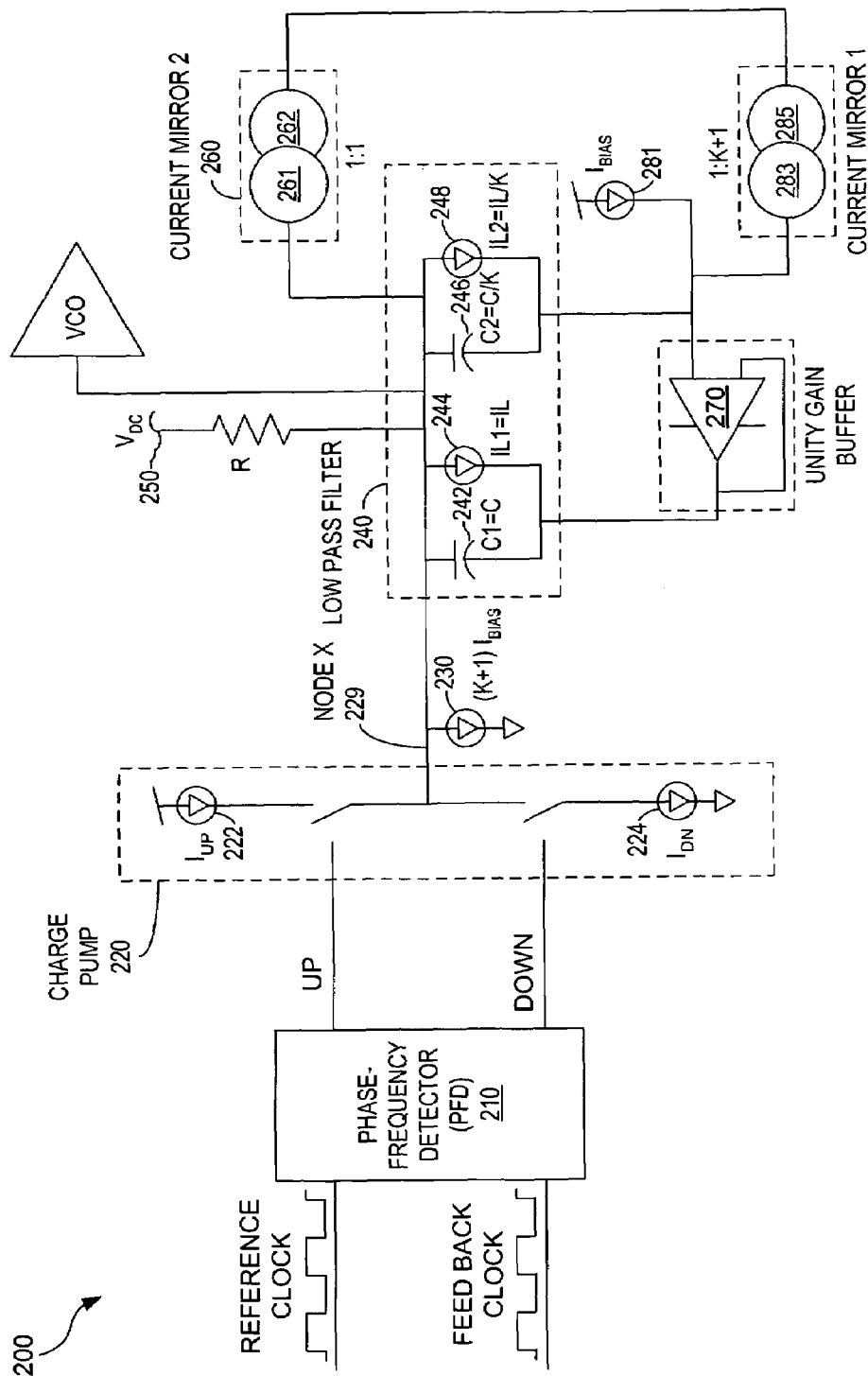
FIG. 2 schematically illustrates a low pass filter of a PLL circuit wherein the leakage current of the low pass filter is compensated for by a current mirror.

Turning now to FIG. 2, illustrated is a system 200 which employs capacitive current leakage correction, such as is used in a PLL. In the system 200, a phase-frequency detector (PFD) 210 is coupled to a charge pump 220. The charge pump 220 has a current source 222 and current sink 224. The PFD 210 compares the difference between phases of a reference clock frequency and the feedback clock frequency to thereby generate signals to charge the capacitor 242 of the low pass filter 240 through use of the current source 222 or the current sink 224. The voltage on the cathode of the low pass filter 240 is then applied to the voltage controlled oscillator (VCO). The VCO generates an oscillatory output signal at a given frequency as a function of the low pass filter 240 voltage. The output of the VCO 140 is then divided in a frequency divider /n 150, and fed back into the PFD 110.(not shown).

The low pass filter 240 comprises a capacitor C1 242 with a capacitance value of "C", and its corresponding leakage current I1 244 coupled to the Node X 229. The low pass filter 240 comprises a capacitor C2 246 with a capacitance value of C/K, and its corresponding leakage current I1/K 248 coupled to the Node X 229. K, which is usually greater than 1, is the ratio of the capacitor size of C1 242 to C2 246. There is also a unity gain buffer 270 coupled to the cathode of the capacitors C1 242 and C2 246. There is an $I_{bias}$ current source 281 coupled to the unity gain buffer, and also to the left side of current mirror1. The right hand side of current mirror1 conducts a current that is "K+1" times larger than that of the left hand side.

The output of the right hand side of current mirror1 is coupled to a current mirror2 260. The current mirror2 260 comprises a first and second current source 261, 262. The ratio of the current between current sources 261 and 262 is substantially one. The current source 261 is coupled to Node X 229. From Node X, there is also a current drain 230 with current equal to $(K+1)I_{bias}$. There is also a VDC source 250, coupled through a resistor R, to Node X. This is used to set the DC operating point of the VCO.

In the system 200, the current sources 222, 224 are turned off and on by the PFD 210 as a function of a comparison between the reference clock and a feedback clock signal. However, the low pass filter 240 comprises a first capacitor C1 242 and a second capacitor C2 246.

In the LPF 240, the leakage current through C1 242 is modeled as IL1 224. Its value is equal to IL. Similarly, the leakage current through C2 246 is modeled as IL2 248. Since the capacitance value of C2 is K times smaller than C1, then IL2=IL/K. This holds true for two reasons. First, the unity gain buffer 270 ensures that C1 and C2 have identical potential across them. Secondly, the only difference between C1 and C2 is the reduction of the area of C2 by a factor of K with respect to that of C1. Therefore, IL2=IL1/K=IL/k. In other embodiments, the dielectric thickness can be changed between the two capacitors as well as using different dielectric materials in both capacitors to change the ratio of capacitances.

There is a current $I_{bias}$ 281, which is on at all times, and keeps constant current flowing through current mirrors 1 and 2. This ensures fast response from these current mirrors. The current through current source 283 is then equal to $I_{bias}$+IL/K.

Due in part to the precise nature of the ability to have quality control in IC chips, the current source 285 has a current draw that is designed to be K+1 times higher than that of current source 283. The larger current draw can be a function of the relative size of the MOS devices—that is, the bigger the device, the larger the current.

The current in current source 285 is then equal to (K+1)($I_{bias}+I_L/K$) {which could be simplified to $KI_{bias}+I_L+I_{bias}+I_L/K$, which can be simplified to (K+1)$I_{bias}+I_L(1+1/K)$}. In any event, this is the current which is supplied by current source 262. Current source 261 of the current mirror2 260 supplies a substantially identical current, i.e. also (K+1) $I_{bias}+I_L(1+1/K)$}.

In the high Z state, the total current discharging Node X is equal to (K+1) $I_{bias}+I_L(1+1/K)$. However, current source 261 provides a charging current that is equal to (K+1) $I_{bias}+I_L(1+1/K)$. Significantly, therefore, as far as Node X is concerned, the net-charge that is being added or removed is equal to 0. In other words, the effect of capacitor leakage on Node X is nullified.

This circuit has at least two benefits. We are not using extra circuitry within the PFD 210 or elsewhere within the charge pump 220 to compensate for leakage currents, which is advantageous in that it does not introduce extra noise into the Node X, the driver node for the VCO. Secondly, this circuit enables leakage compensation even in processes where the leakage current characteristics are not well modeled.

It is understood that the present invention can take many forms and embodiments. Accordingly, several variations may be made in the foregoing without departing from the spirit or the scope of the invention. The capabilities outlined herein allow for the possibility of a variety of programming models. This disclosure should not be read as preferring any particular programming model, but is instead directed to the underlying mechanisms on which these programming models can be built.

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Many such variations and modifications may be considered desirable by those skilled in the art based upon a review of the foregoing description of preferred embodiments. Accordingly, it is appropriate that the appended claims be construed broadly and in a manner consistent with the scope of the invention.

What is claimed is:

1. A low pass filter, comprising:
a first capacitor, the first capacitor having a first associated leakage current;
a second capacitor, the second capacitor having a specified capacitance that is a fraction of the capacitance of the first capacitor, the second capacitor further having a second associated leakage current;
a voltage follower circuit coupled to the output of the first and second capacitors;
first and second current sources coupled to the voltage follower circuit;
a bias current source coupled to the drain of the first current source; and
a current mirror coupled to the drain of the second current source, the current mirror further coupled to at least the anode of the first capacitor.

2. The system of claim 1, further comprising a bias current sink coupled to the anode of the first capacitor.

3. The system of claim 1, wherein the second associated leakage current is in proportion to the first associated leakage current as the second capacitance is proportional to the first capacitance.

4. The system of claim 1, wherein the first current source conducts current of both the bias current and the second leakage current.

5. The system of claim 4, wherein the second current source conducts a current substantially equal to current through the first current source times the capacitive proportionality of the first capacitor to the second capacitor, plus the integer one.

6. The system of claim 4, wherein the current mirror conducts through the second current source a current substantially equal to current through the first current source times the capacitive proportionality of the first capacitor to the second capacitor, plus the integer one.

7. The system of claim 4, wherein the current mirror conducts into a node adjoining the first and second capacitor a current substantially equal to current through the first current source times the capacitive proportionality of the first capacitor to the second capacitor, plus the integer one.

8. The circuit of claim 1, wherein the circuit further comprises a phase locked loop.

9. The circuit of claim 1, further comprising a charge pump coupled to the anode of the first and second capacitors.

10. The circuit of claim 9, wherein the charge pump further comprises a current source.

11. The circuit of claim 9, wherein the charge pump further comprises a current sink.

12. The circuit of claim 9, further comprising a phase frequency detector coupled to the charge pump.

13. A method of compensating for leakage current in a capacitor, comprising:
sinking a first leakage current;
sinking a second leakage current which is proportional to a first leakage current;
generating a bias current;
conducting a mirrored current that is a multiplicative factor of the first leakage current plus the bias current; and
replacing the first leakage current and the second leakage current with at least a proportion of the mirrored current.

14. A processor for compensating for leakage current, the processor including a computer program comprising:
computer code for sinking a first leakage current;
computer code for sinking a second leakage current which is proportional to a first leakage current;
computer code for generating a bias current;
computer code for conducting a mirrored current that is a multiplicative factor of the first leakage current plus the bias current; and
computer code for replacing the first leakage current and the second leakage current with at least a proportion of the mirrored current.

15. A computer program product for compensating for leakage current, the computer program product having a medium with a computer program embodied thereon, the computer program comprising:
computer code for sinking a first leakage current;
computer code for sinking a second leakage current which is proportional to a first leakage current;

computer code for generating a bias current;

computer code for conducting a mirrored current that is a multiplicative factor of the first leakage current plus the bias current; and computer code for replacing the first leakage current and the second leakage current with at least a proportion of the mirrored current.

\* \* \* \* \*